United States Patent [19]

Losee et al.

[11] Patent Number: 4,908,518
[45] Date of Patent: Mar. 13, 1990

[54] INTERLINE TRANSFER CCD IMAGE SENSING DEVICE WITH ELECTRODE STRUCTURE FOR EACH PIXEL

[75] Inventors: David L. Losee; Timothy J. Tredwell, both of Fairport, N.Y.; David M. Boisvert, Stanford, Calif.

[73] Assignee: Eastman Kodak Company, Rochester, N.Y.

[21] Appl. No.: 309,646

[22] Filed: Feb. 10, 1989

[51] Int. Cl.$^4$ .............................................. H01J 40/14
[52] U.S. Cl. .................................. 358/213.23; 357/24
[58] Field of Search .................... 250/578; 357/30, 24, 357/59

[56] References Cited

U.S. PATENT DOCUMENTS

| | | | |
|---|---|---|---|
| 4,228,445 | 10/1980 | Tasch et al. | 357/24 |
| 4,229,752 | 10/1980 | Hynecek | 357/24 |
| 4,613,402 | 9/1986 | Losee et al. | 357/24 |
| 4,772,565 | 9/1988 | Kamimura et al. | 437/004 |

Primary Examiner—David C. Nelms
Assistant Examiner—Stephone B. Allen
Attorney, Agent, or Firm—Raymond L. Owens

[57] ABSTRACT

In interline transfer type are image sensor wherein photogenerated charge is transferred from a pixel into a charge coupled dvice (CCD) or shift register. The CCD structure is typically composed of two or more overlapping levels of polysilicon electrodes associated with each row of pixels. In accordance with invention, a CCD with simplified structure and hence improved manufacturability is described. The CCD utilizes ion implanted barrier regions, which may be self-aligned such as described by Losee et al. U.S. Pat. No. 4,613,402, to produce a device with single polysilicon electrode associated with each pixel.

5 Claims, 4 Drawing Sheets

INTERLINE TRANSFER CCD IMAGE SENSING DEVICE WITH ELECTRODE STRUCTURE FOR EACH PIXEL

FIELD OF THE INVENTION

This invention relates to image sensing devices and, more particularly, to interline transfer charge coupled imagers.

BACKGROUND OF THE INVENTION

In interline transfer imaging devices, photogenerated charge is collected at a photocharge collecting site or node (pixel) on a pn junction or under the gate of a photocapacitor, for a period of time and then transferred into a charge coupled register to be detected by an output circuit. In an area array of such photocharge collection sites it is necessary to transfer the collected photocharge, first to a vertical shift register and then to a horizontal shift register, finally, reaching a charge sensitive detector or amplifier. In prior art, such as disclosed in Kamimura et al, U.S. Pat. No. 4,772,565, for example, and indicated schematically in FIGS. 1 and 2, a given row of pixels 10 is addressed by application of a voltage to electrodes 20 and 30, composed respectively of first and second levels polycrystalline silicon (poly-1 and poly-2) and, which are both connected to the same vertical clock, $\phi_1$. Upon application of a voltage, photocharge is transferred to a buried channel 40 of the vertical shift register. Electrical isolation between photodiodes and the vertical shift register is provided by a channel stop region 15, also indicated in FIG. 1. As shown in FIG. 2, this vertical shift register is composed of buried channel 40, overlapping electrodes 20 and 30 which are connected to vertical clock $\phi_1$, and overlapping poly-1 and poly-2 electrodes 50 and 60 which are connected to vertical clock $\phi_2$. These electrodes are separated from the substrate semiconductor 70 by an insulating layer 80. The regions 65 beneath electrodes 30 and 60 are ion implanted to provide a potential energy difference between regions 25 and 26, controlled by the $\phi_1$ clock, and between regions 55 and 56, controlled by the $\phi_2$ clock. The imaging device is operated in an interlaced mode where a first field of photocharge from imaging sites or pixels on, say, odd numbered rows of photosites, is read out and, subsequently, sites on even numbered rows are read out as a second field. For example, all photosites adressed by the $\phi_1$ clock are read out, and then as the second field, those addressed by the $\phi_2$ clocks, are read out. Overall, the design requires two electrodes for each row of imaging pixels or sites. These electrodes are patterned from two layers of doped polysilicon deposited at two different times. They are often referred to as first level of polysilicon (poly-1) and a second level of polysilicon (poly-2). Such a structure is subject to yield limitations due to short circuits, caused by photomasking imperfections, between electrodes of either the first or second levels of polysilicon. Such short circuits can cause severe loss of image information or result in total inoperability of the device.

SUMMARY OF THE INVENTION

It is an object of this invention to provide an interline transfer type image sensor with simplified design which is more tolerant of the short circuits between poly-1 and poly-2 for each pixel site.

This object is achieved by an interline transfer type area image sensor leaving an array of columns and rows of separate pixels and wherein charge collected in a pixel is transferred into a CCD, such CCD comprising a series of overlapping electrodes, with each electrode being formed from a single level of conductor, each pixel being associated with only one electrode, separate voltage clocks connected to alternate electrodes, an ion implanted barrier being formed under an edge region of each electrode, and means for transferring charge from each pixel into a region under its corresponding electrode.

The present invention discloses an area image sensor in which a single polysilicon electrode constructed from a single level or layer of conductor is associated with each row of pixels. Such a simplification of the structure allows a relaxation of design tolerances and results in a more manufacturable device.

Figure 1:
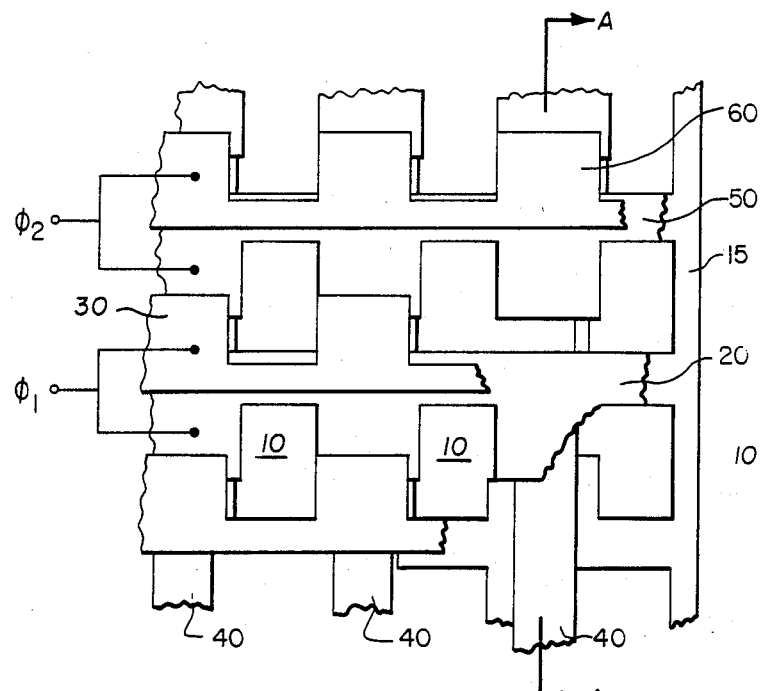
FIG. 1 is a plan view of a typical prior art imaging device.
Figure 2:
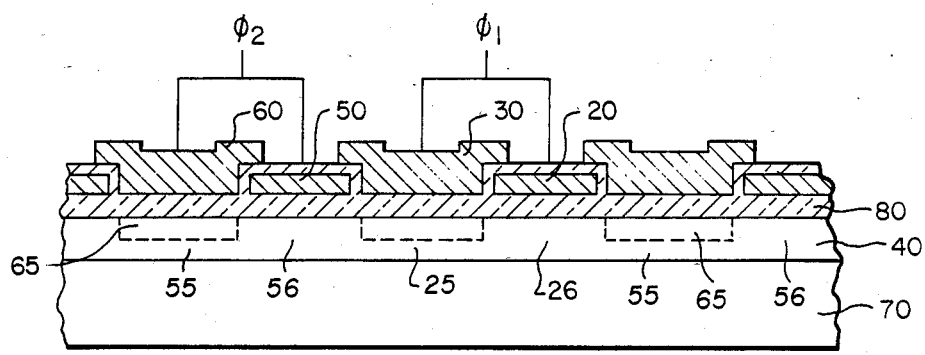
FIG. 2 is a fragmentary, partially schematic vertical section view through a semiconductor device, taken along the lines A—A of FIG. 1 further illustrating the prior art construction.
Figure 3A:
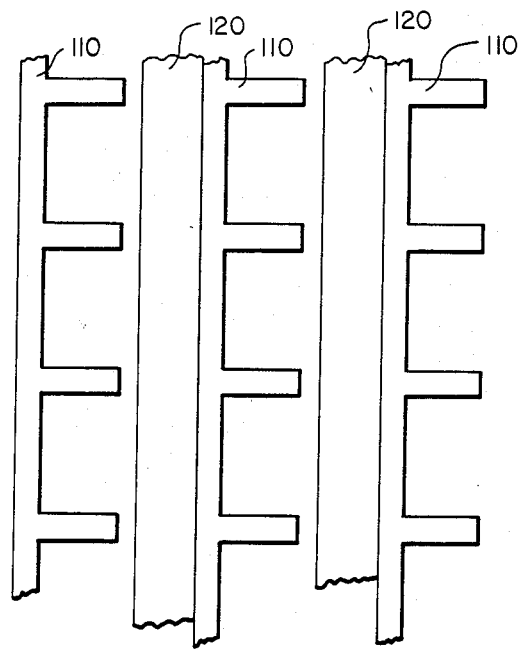
FIGS. 3a-3c are plan views illustrating various stages in the construction of an embodiment of the present invention.
Figure 3B:
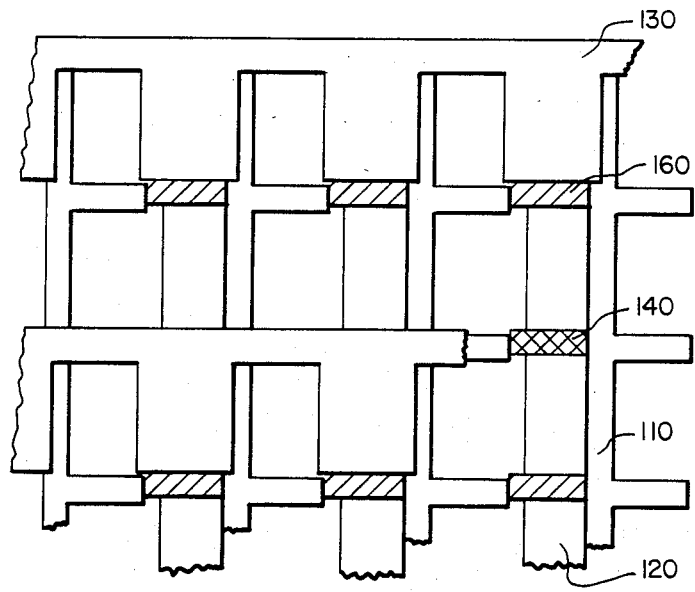
Figure 3C:
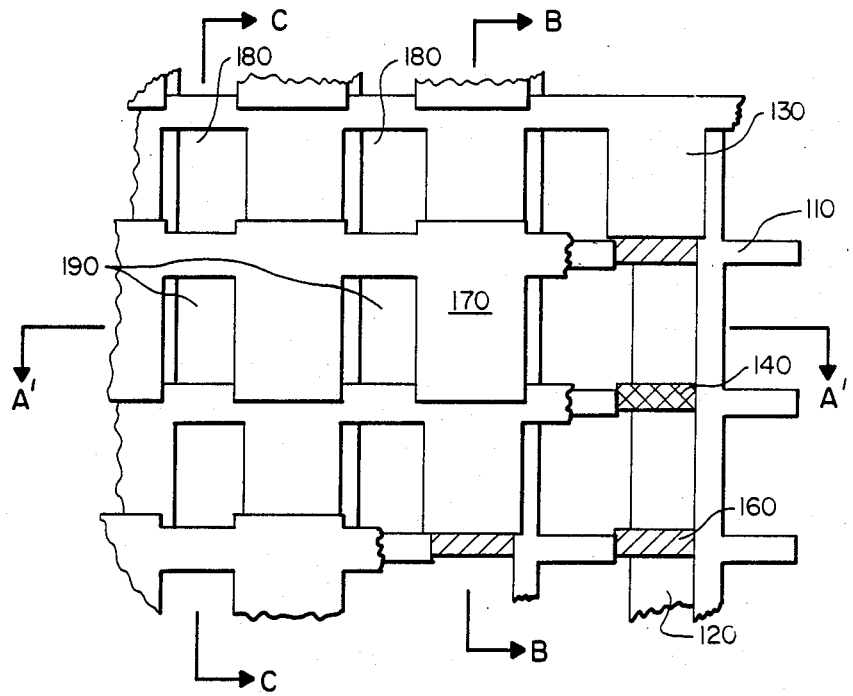
Figure 4A:
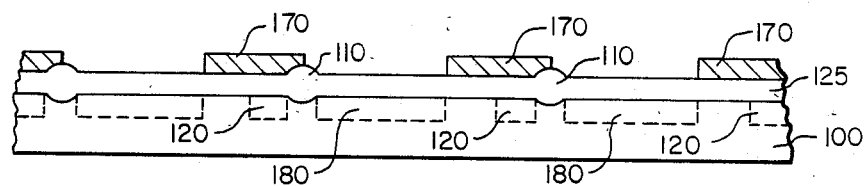
FIGS. 4a-4c are fragmentary, partially schematic cross-sectional views taken along the lines A—A, B—B, and C—C of FIG. 3c, respectfully.
Figure 4B:
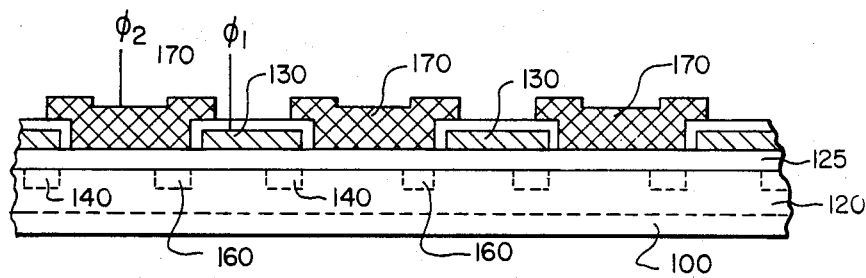
Figure 4C:
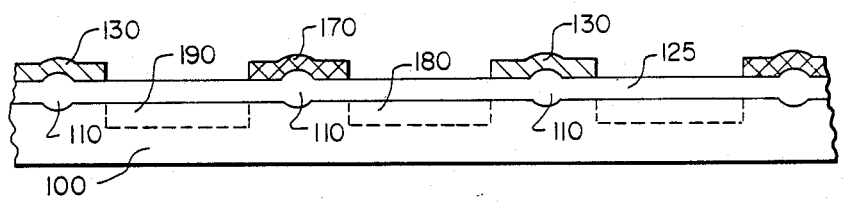

MODES OF CARRYING OUT THE INVENTION:

With reference to FIGS. 3a-c and 4a-c, a semiconductor substrate 100 is provided with channel stop regions 110 and buried channel regions 120 as shown in plan view in FIG. 3a. As shown in FIG. 3b and FIG. 4b, an insulating oxide 125 is grown over the semiconductor surface and a single layer or level of polysilicon 130 is deposited and patterned. A barrier region is provided in regions 140 by methods such as described by Losee et al. in U.S. Pat. No. 4,613,402. The barrier region 140 is provided under the edge of electrode 130. Turning now to FIG. 3c and FIG. 4c, an insulating layer of oxide is then grown over the polysilicon conductor 130 and a second barrier region 160 is provided by ion implantation of appropriate dopant atoms. A second layer of polysilicon conductor is deposited and patterned to form electrodes 170. The barrier region 160 is thus provided under the edge of electrode 160. Regions 180 and 190, which are not covered with the polysilicon electrodes are then implanted with appropriate impurities to form an array of imaging sites of photodiode pixels for collection of photogenerated charge. Adjacent electrodes are connected to different voltage clocks. As shown in FIG. 4b, electrode 170 is connected to clock $\phi_2$ and electrode 130 is connected to clock $\phi$.

Operation of the device is as follows: Light incident on the photosites 180 and 190 is absorbed and generates electron-hole pairs. The photogenerated electrons are collected by the electronic fields surrounding sites 180 and 190. At the end of a period of time, a positive voltage is applied to one of the electrodes, for example electrode 130, and the photocharge from region 180 is transferred to the storage region under said electrode, region 121 of FIG. 4b in this case. Electrodes 130 and 170 are then clocked to sequentially transfer photocharges from all such photosites 180 to charge detection circuitry. Subsequently, the second field of photosites, 190 are read out by applying a positive voltage to electrode 170, thus transferring photocharge to the storage region 122, under said electrode 170. Again electrodes 130 and 170 are clocked to sequentially transfer photocharges from all such photosites 190 to charge detection circuitry. In this way, charges associated with the field of pixels 180 is read out by first clocking only a single electrode 130 with a positive voltage and the field of pixels 190 is read out by clocking only electrode 170 with a positive voltage. It is, of course, understood that the above description is that of an n-channel device. An analogous description of a p-channel device could be made wherein voltages are of reversed polarity and photo-generated holes are collected and transferred.

Figure 5:
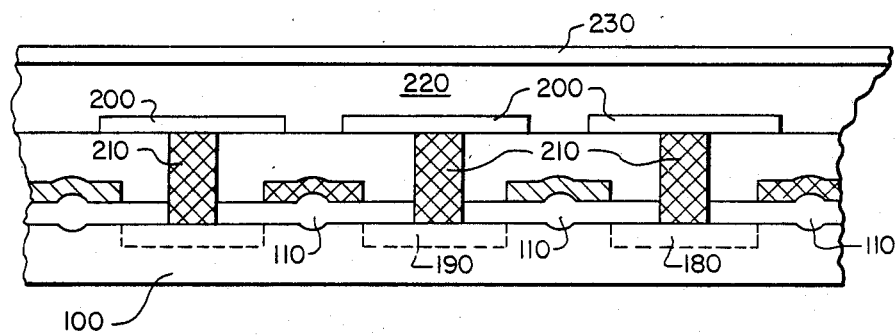
FIG. 5 is a fragmentary, partially schematic cross-section of another embodiment of the present invention.

An alternative embodiment of this invention is shown schematically in FIG. 5. FIG. 5 is a cross-section through the alternate embodiment corresponding to the lines C—C indicated in FIG. 3c. In this alternative embodiment the imaging charge collection regions of the device, 180 and 190 are connected to capacitor plates 200 through a conducting pillar 210. Such a conducting pillar was fabricated as described by Raley et al., J. Electrochemical Soc. 135, 2640 (1988). The capacitor plates were covered with a photoconducting layer 220 composed of amorphous silicon and top electrode, layer 230, of transparent conducting induim-tin oxide. Photogenerated charge generated in the photoconducting layer 20 is transferred across the photoconductive layer 220 to the capacitor plates 200 and then transferred to the charge collecting regions 180 via pillars 210. Charge in region 80 is then transferred to the vertical shift register and read out as described in the preceeding paragraph. Subsequently, the second field, regions 190, is read out in a similar manner.

The conductive electrodes 130 and 170 and capacitor plates 200 can be composed of composite layers of polysilicon covered with a metal silicide selected from the group consisting of $WSi_x$, $MoSi_x$, $TiSi_x$, W, Mo, or Ta.

EXAMPLE

An n-type semiconductor doped to approximately 30 ohm-cm resistivity was implanted with boron atoms with a dose of $1.0E+12$ cm$^{}-2$, which were subsequently diffused to a depth of thickness of approximately 3.5 µm. Channel stop barrier regions were formed by implantation of boron with a dose of $1.0E+13$ cm$^{}-2$, and subsequently growing an oxide of thickness approximately 4000 A. An additional oxidation and subsequent etch-back reduced this oxide to a thickness of approximately 2500 A. A transfer channel region was formed by ion implantation of phosphorus atoms, with a total does $3.25E+12$ cm$^{}-2$, and transfer gate oxide approximately 500 A thick, were grown in the charge transfer region and over the photodiode regions. A polysilicon electrode and edge aligned boron implanted barrier region was then formed according to procedures described by Losee et al., U.S. Pat. No. 4,613,402, and phosphorus was implanted into the photodiode region with adose of $7.0E+12$ cm$^{}-2$. A thin oxide layer was grown at a temperature of 950° C., in a wet ambient, for approximately 10 minutes, and a layer of approximate composition $WSi_3$ and thickness approximately 2000 A was deposited by sputtering and patterned to form an opaque shield over the CCD shift registers and openings over the photodiodes. An insulating layer was deposited by chemical vapor deposition, consisting of approximately 1000 A undoped oxide covered by 5000 A of oxide doped with approximately 4 wt % boron and 4 wt % phosphorus. The device was subsequently annealed in an inert ambient for 30 minutes at a temperature of 1000° C., contact openings are etched and an aluminum interconnect pattern was fabricated. Subsequently, a color filter array was applied according to procedures described by Pace et al. in European Patent EP 249991 A. The pixel dimensions of this device were 8.6 µm, horizontally, by 6.8 µM vertically.

The invention has been described in detail with particular reference to certain preferred embodiments thereof, but it will be understood that variations and modifications can be effected within the spirit and scope of the invention.

We claim:

1. An interline transfer type area image sensor having an array of columns and rows of separate pixels and wherein charge collected in a pixel is transferred into a CCD, such CCD comprising a series of overlapping electrodes, with each electrode being formed from a single level of conductor, separate voltage clocks connected to alternate electrodes, each pixel being associated with only one electrode, an ion implanted barrier region being formed under an edge of each electrode, and means for transferring charge from each pixel into a region under its corresponding electrode.

2. An image sensor device as in claim 1 wherein the conductor of each electrode is formed of doped polysilicon.

3. An image sensor device as in claim 1 wherein said electrodes are composed of composite layers of polysilicon and a metal silicide selected from the group consisting of $WSi_x$, $MoSi_x$, $TiSi_x$, W, Mo, or Ta.

4. An image sensor device as in claim 1 where each pixel includes a photodiode.

5. An image sensor device as in claim 1 wherein each pixel comprises a photoconducting layer, a capacitor plate connected to such photoconducting layer, a charge collecting region, and a conducting pillar coupling the capacitor to the charge collecting region such that photogenerated charge produced in the photoconducting layer is transferred to the charge collecting region, whereby such charge is subsequently transferred into the CCD.

* * * * *